United States Patent [19]

Yamamoto

[11] Patent Number: 5,297,080
[45] Date of Patent: Mar. 22, 1994

[54] SENSE AMPLIFIER IN SEMICONDUCTOR MEMORY DEVICE

[75] Inventor: Yasuhiro Yamamoto, Kasugai, Japan

[73] Assignees: Fujitsu Limited, Kawasaki; Fujitsu VLSI Limited, Kasugai, both of Japan

[21] Appl. No.: 727,598

[22] Filed: Jul. 9, 1991

[30] Foreign Application Priority Data

Jul. 9, 1990 [JP] Japan .................................. 2-181888

[51] Int. Cl.⁵ .......................................... H03K 5/153
[52] U.S. Cl. .................. 365/190; 365/189.01; 365/189.05; 365/202
[58] Field of Search ........... 307/530; 365/190, 189.01, 365/189.05, 202

[56] References Cited

U.S. PATENT DOCUMENTS

| | | | |
|---|---|---|---|
| 4,553,053 | 11/1985 | Ong et al. ............................ | 365/190 |
| 4,604,533 | 8/1986 | Miyamoto et al. .................. | 365/190 |
| 4,668,881 | 5/1987 | Piasecki .............................. | 307/530 |
| 4,758,995 | 7/1988 | Sato .................................... | 365/189.05 |
| 4,991,141 | 2/1991 | Tran .................................... | 307/530 |
| 5,124,589 | 6/1992 | Shiomi et al. ...................... | 365/189.05 |
| 5,151,879 | 9/1992 | Hsueh et al. ........................ | 365/190 |
| 5,168,467 | 12/1992 | Fukushi ............................... | 365/189.01 |
| 5,172,340 | 12/1992 | Leforestier et al. ................ | 307/530 |

*Primary Examiner*—William L. Sikes
*Assistant Examiner*—Scott A. Ouelette
*Attorney, Agent, or Firm*—Staas & Halsey

[57] ABSTRACT

A sense amplifier in a semiconductor memory device includes a detection unit for generating complementary state signals showing a state of a pair of bit lines coupled to a plurality of memory cells in the semiconductor memory device in which word lines are coupled to the memory cells, and a latch circuit for receiving the complementary signals and a reference signal and for inverting states of complementary output signals of the latch means only when one of the complementary state signals decreases and becomes lower than the reference voltage.

14 Claims, 5 Drawing Sheets

SENSE AMPLIFIER IN SEMICONDUCTOR MEMORY DEVICE

BACKGROUND OF THE INVENTION (1) Field of the Invention

The present invention generally relates to a sense amplifier in a semiconductor memory device, and more particularly, to a sense amplifier which detects cell data read out from a memory cell in a semiconductor memory device and amplifies the readout cell data.

(2) Description of the Prior Art

FIG. 1 is a circuit diagram of an SRAM (Static Random Access Memory) having a conventional sense amplifier. A column select signal CS having a high (H) level is applied to bases of transistors Tr3, Tr4 and Tr5 at the same time as word lines WL1 and WL2 are selected. The transistors Tr3–Tr5 are turned ON in response to the column select signal CS, so that bit lines BL and $\overline{BL}$ are selected and a memory cell 1 connected to both the selected bit lines BL and $\overline{BL}$ and the selected word lines WL1 and WL2 is activated. The memory cell 1 is comprised of bipolar transistors. A plurality of memory cells 1 are coupled to the bit lines BL and $\overline{BL}$. When the memory cell 1 shown in FIG. 1 is selected, the other memory cells connected to the bit lines BL and $\overline{BL}$ are not selected. In this state, complementary voltage signals (cell data) are read out from the selected (activated) memory cell 1 and transferred to the bit lines BL and $\overline{BL}$. In response to the readout cell data, a pre-sense amplifier (also referred to as a first sense amplifier) 2 senses the difference between the potentials of the bit lines BL and $\overline{BL}$. The pre-sense amplifier 2 shown in FIG. 1 is a voltage-sense type amplifier and comprises transistors Tr1 and Tr2. When the cell data is such that it increases the bit line BL to the high (H) level and decreases the bit line $\overline{BL}$ to a low (L) level when read out from the memory cell 1, a collector current of the transistor Tr1 drawn from a final sense amplifier (also referred to as a second sense amplifier) 3 via a readout current signal line (hereafter simply referred to as a read line) RD becomes greater than that of the transistor Tr2 drawn from the second sense amplifier 3 via a read line $\overline{RD}$. Transistors Tr21 and Tr22 are connected to the bit lines BL and $\overline{BL}$, respectively. An AND logic signal obtained by executing an AND logic operation on a write enable signal WE and a write data signal Din is applied to the base of the transistor Tr21. An AND logic signal obtained by executing an AND logic operation on an inverted version $\overline{WE}$ of the write enable signal WE and the write data signal Din is applied to the base of the transistor Tr22.

During the above-mentioned cell data readout operation, a fixed reference signal Vref1 is input to bases of input transistors Tr6 and Tr7 of the second sense amplifier 3, so that the transistors Tr6 and Tr7 are activated. When the transistors Tr1 and Tr2 operate in the state where the transistors Tr6 and Tr7 are ON, if the potential of the bit line BL based on the data read out from the selected memory cell 1 is higher than that of the bit line $\overline{BL}$, a collector current of the transistor Tr6 becomes greater than that of the transistor Tr7. Thus, a voltage drop developed across a resistor R1 is greater than a voltage drop developed across a resistor R2. Thus, the potential of the base of a transistor Tr8 becomes lower than that of the base of a transistor Tr9. The potentials of the bases of the transistors Tr8 and Tr9 are amplified thereby, so that complementary output signals OUT and $\overline{OUT}$ are generated. Diodes D1 and D2 which are respectively coupled to the emitters of the transistors TrB and Tr9 serve as level shift diodes which adjust the voltage levels of the complementary output signals OUT and $\overline{OUT}$. I1 through I4 are constant-current sources.

In order to increase the data readout speed, it is possible to increase the speed of selecting the bit lines BL and $\overline{BL}$. However, in this case, there is a possibility that an unintended bit line pair may be selected at the same time as the true bit line pair is selected or no bit line pair is selected. In such a case, the current input to the final sense amplifier 3 via the read line RD is almost the same as that input thereto via the read line $\overline{RD}$. Thus, both the output currents OUT and $\overline{OUT}$ have intermediate levels. Such intermediate levels cause a malfunction of an ECL (Emitter-Coupled Logic) circuit connected to the output side of the second sense amplifier 3 and/or cause changes in the output levels OUT and $\overline{OUT}$ although the same cell data as the previously read data is read out.

SUMMARY OF THE INVENTION

It is a general object of the present invention to provide an improved sense amplifier in which the above-mentioned disadvantages are eliminated.

A more specific object of the present invention is to provide a sense amplifier which definitely generates the intended complementary output signals at a high speed even if a plurality of bit line pairs are selected or no bit line pair is selected.

The above-mentioned objects of the present invention are achieved by a sense amplifier in a semiconductor memory device comprising: detection means for generating complementary state signals exhibiting state of a pair of bit lines coupled to a plurality of memory cells in the semiconductor memory device in which word lines are coupled to the memory cells; and latch means, operatively coupled to the detection means, for receiving the complementary signals and a reference signal and for inverting states of complementary output signals of the latch means only when one of the complementary state signals decreases and becomes lower than the reference voltage.

DESCRIPTION OF THE PREFERRED EMBODIMENTS

Figure 1:
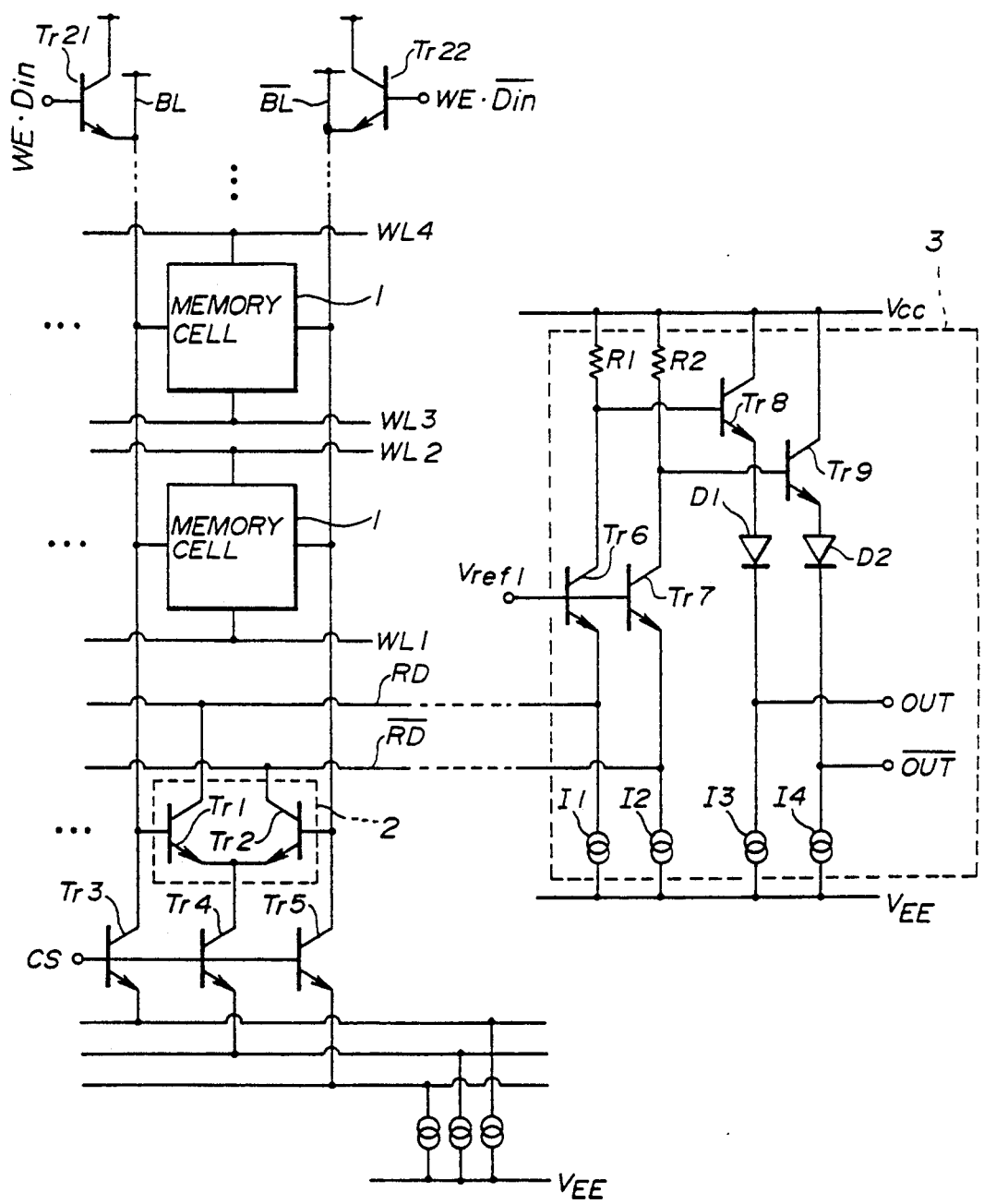
FIG. 1 is a circuit diagram of an SRAM having a conventional sense amplifier.
Figure 2:
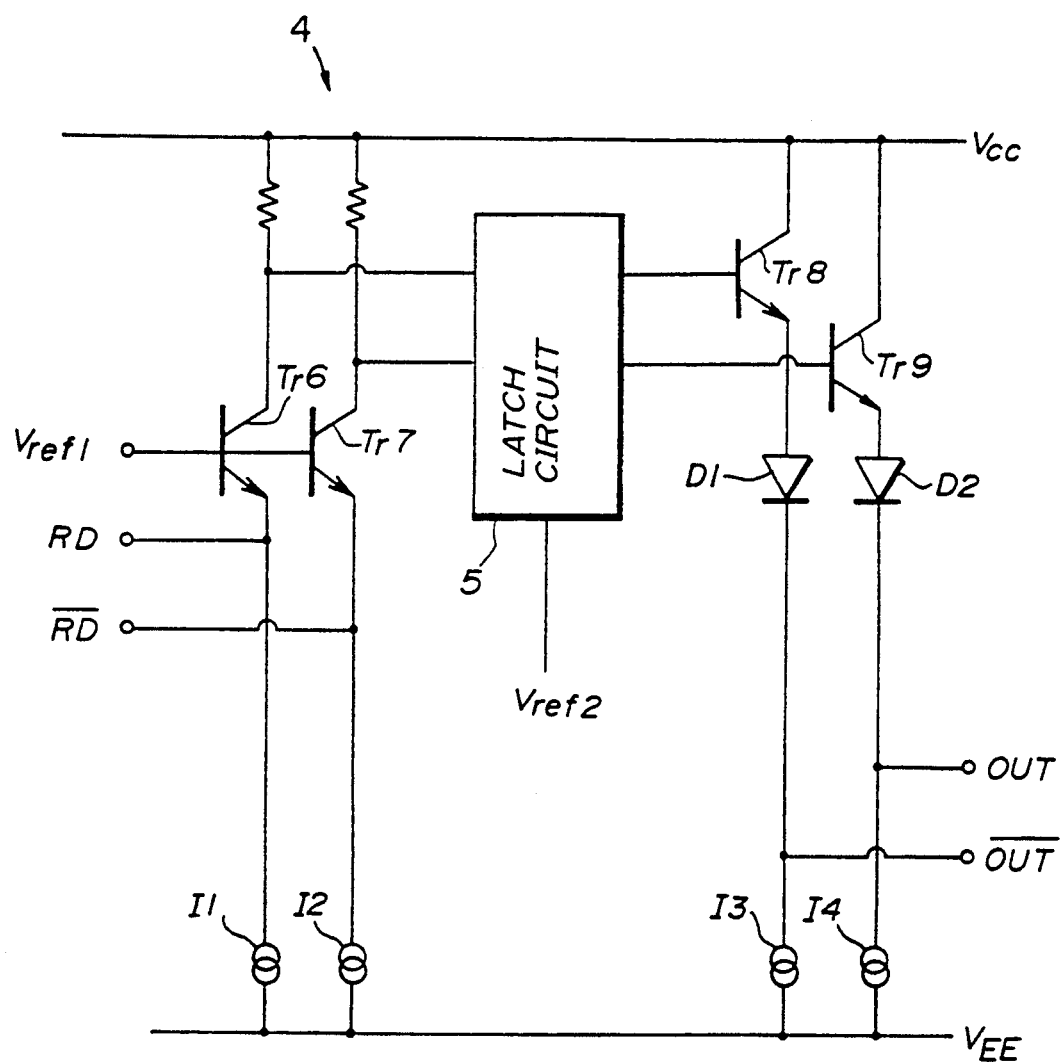
FIG. 2 is a block diagram showing an overview of a preferred embodiment of the present invention.

FIG. 2 is a block diagram showing an overview of a preferred embodiment of the present invention. The configuration shown in FIG. 2 is intended as an improvement of the aforementioned second sense amplifier 3 shown in FIG. 1. In FIG. 2, those parts which are the same as those shown in FIG. 1 are given the same reference numerals. A second amplifier 4, which is to replace the second amplifier 3 (FIG. 2), has a latch circuit 5 provided between a pair of transistors Tr6 and Tr7 and a pair of transistors Tr8 and Tr9. A reference voltage Vref2 is applied to the latch circuit 5. The latch circuit 5 receives the complementary voltage signals from the transistors Tr6 and Tr7. The latch circuit 5 inverts the states of its complementary output signals only when one of the complementary voltage signals from the transistors Tr6 and Tr7 decreases from the high level and becomes lower than the reference voltage Vref2. When one of the complementary voltage signals decreases but does not become lower than the reference voltage Vref2, the latch circuit 5 does not change the respective states of the complementary output signals. Even when one of the complementary signals increases from the low level and exceeds the reference voltage Vref2, the latch circuit 5 does not change the states of the complementary output signals. Even if both the complementary voltage signals from the transistors Tr6 and Tr7 have intermediate levels higher than the reference voltage Vref2, the latch circuit 5 does not change the states of the complementary output signals.

It is preferable that the latch circuit 5 operate independently of a clock which is the base of the entire operation of the SRAM. That is, it is preferable that the latch circuit 5 is an asynchronous type latch circuit which does not need a clock signal. For example, the latch circuit 5 is an RS flip-flop.

Figure 3:
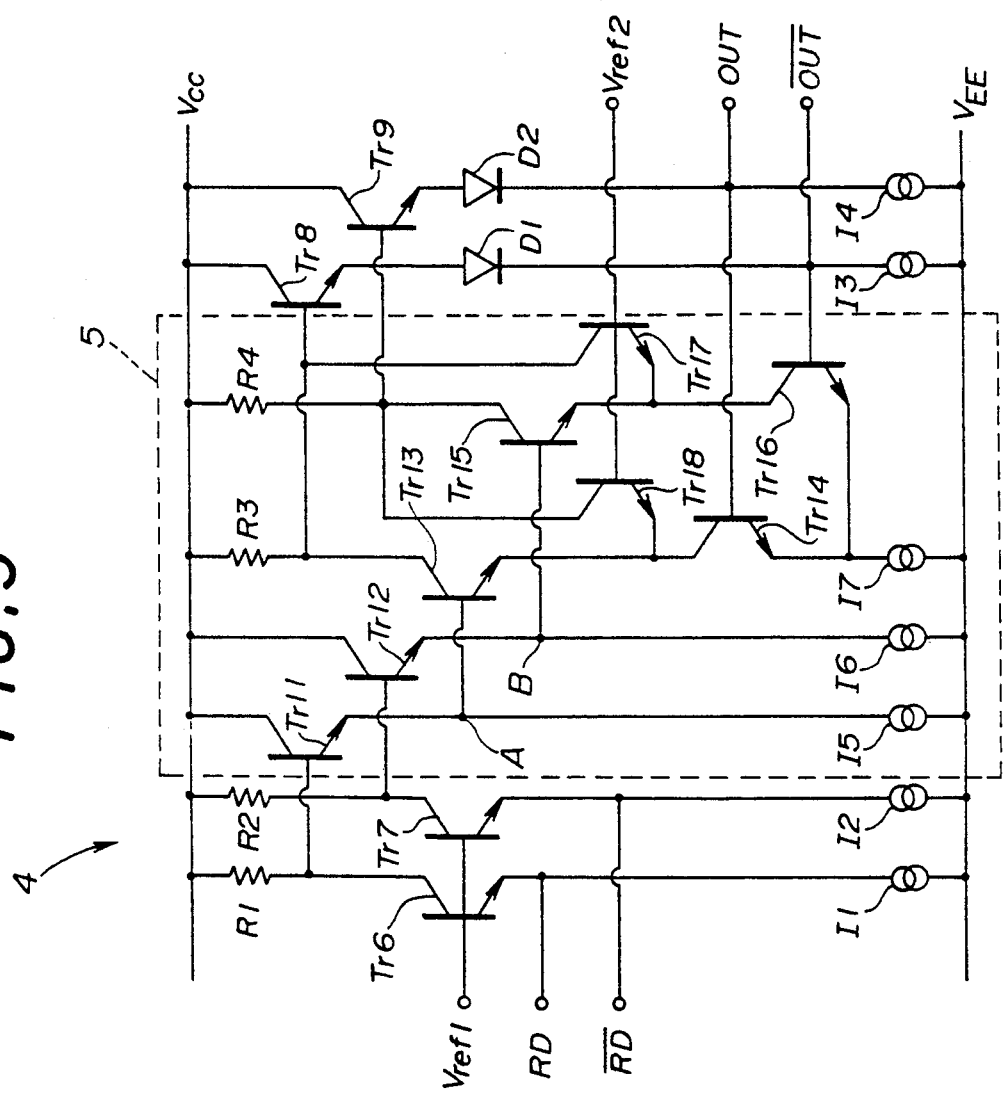
FIG. 3 is a circuit diagram of the embodiment shown in FIG. 2 in more detail.

FIG. 3 is a circuit diagram of the second amplifier 4 shown in FIG. 2 in more detail. In FIG. 3, those parts which are the same as those shown in FIGS. 1 and 2 are given the same reference numerals. The emitters of the transistors Tr6 and Tr7, are connected to the read lines RD and $\overline{RD}$, respectively, which carry the complementary voltage signals from the pre-sense amplifier 2 shown in FIG. 1. The collector of the transistor Tr6 is connected to the base of a transistor Tr11. The collector of the transistor Tr11 is connected to a high-potential power supply line $V_{CC}$, and the emitter thereof is connected to a low-potential power supply line $V_{EE}$ via a constant-current source I5. The collector of the transistor Tr7 is coupled to the base of a transistor Tr12. The collector of the transistor Tr12 is connected to the high-potential power supply line $V_{CC}$, and the emitter thereof is coupled to the low-potential power supply line $V_{EE}$ via a constant-current source I6.

The emitter of the transistor Tr11 is connected to the base of a transistor Tr13. The collector of the transistor Tr13 is coupled to the high-potential power supply line $V_{CC}$ via a resistor R3 and connected to the base of the output transistor Tr8. The emitter of a transistor Tr15 is connected to the collector of a transistor Tr16. The base of the transistor Tr14 is connected to a first output terminal and supplied with an output voltage signal OUT. The emitter of the transistor Tr14 is coupled to the low-potential power supply line $V_{EE}$ via a constant current source I7.

The emitter of the transistor Tr12 is connected to the base of the transistor Tr15. The collector of the transistor Tr15 is coupled to the high-potential power supply line $V_{CC}$ via a resistor R4, and connected to the base of the output transistor Tr9. The emitter of the transistor Tr13 is connected to the collector of a transistor Tr14. The base of the transistor Tr16 is connected to a second output terminal, and receives the output voltage signal $\overline{OUT}$. The emitter of the transistor Tr16 is coupled to the low-potential power supply line $V_{EE}$ via a constant-current source I7.

The base of the transistor Tr8 is connected to the collector of a transistor Tr17. The aforementioned reference voltage Vref2 is applied to the base of the transistor Tr17. The emitter of the transistor Tr17 is connected to the collector of the transistor Tr16. The base of the transistor Tr9 is connected to the collector of the transistor Tr18. The reference voltage Vref2 is applied to the base of the transistor Tr18, the emitter of which is connected to the collector of the transistor Tr14. The transistors Tr13 and Tr15 are turned ON when one of the base potentials thereof becomes lower than the reference voltage Vref2 and the other base potential becomes higher than the reference voltage Vref2. The transistor Tr18 is turned ON when the transistor Tr13 is turned OFF. The transistor Tr17 is turned ON when the transistor Tr15 is turned OFF. The transistors Tr14 and Tr16 operate so that one of them turns ON and the other transistor turns OFF.

The transistors Tr11 and Tr12 function as a level adjustment means for determining the base potentials of the transistors Tr13 and Tr15. The RS flip-flop function is realized by the transistors Tr13–Tr18. Particularly, the transistors Tr14 and Tr16 function as a feedback circuit. The reference voltage Vref2 is determined so that it is between the high and low levels of the transistors Tr13 and Tr15.

When the current passing through the read line $\overline{RD}$ increases and the current passing through the read line RD decreases, and in response to the operation of the transistors Tr6 and Tr7, the base potential of the transistor and the base voltage of the transistor Tr12 increases. Then, the base potential of the transistor Tr13 becomes lower than the reference voltage Vref2, so that the transistor Tr13 is turned OFF and the transistor Tr18 is turned ON. Thus, the base potential of the transistor Tr15 becomes higher than the reference voltage Vref2, so that the transistor Tr15 is turned ON and the transistor Tr17 is turned OFF. In response to the above operation, the output transistor Tr8 is turned ON due to an increase in the base potential thereof, and the output transistor Tr9 is turned OFF due to a decrease in the base potential thereof. As a result, the output voltage signal OUT becomes the low level and the output voltage signal $\overline{OUT}$ becomes the high level. In response to these changes in the complementary output voltage signals OUT and $\overline{OUT}$, the transistor Tr14 is turned OFF and the transistor Tr16 is turned ON, so that the above-mentioned states of the output voltage signals OUT and $\overline{OUT}$ are continuously maintained.

On the other hand, when the current passing through the read line RD increases and the current passing through the read line $\overline{RD}$ decreases, the base potential of the transistor Tr11 increases in response to the operation of the transistors Tr6 and Tr7, and the base potential of the transistor Tr12 decreases. Then, the base potential of the transistor Tr12 becomes higher than the reference voltage Vref2, so that the transistor Tr13 is turned ON and the transistor Tr18 is turned OFF. Thus, the base potential of the transistor Tr15 becomes lower than the reference voltage Vref2, so that the transistor Tr15 is turned OFF and the transistor Tr17 is turned ON. In response to these changes, the base potential of the output transistor Tr8 decreases, so that it is turned OFF, and the base potential of the output transistor Tr9 increases, so that it is turned ON. As a result, the output voltage signal OUT becomes the high level, and the output voltage signal $\overline{\text{OUT}}$ becomes the low level. Thus, the transistor Tr14 is turned ON and the transistor Tr16 is turned OFF, so that the states of the output voltage signals OUT and $\overline{\text{OUT}}$ are maintained.

Figure 4:
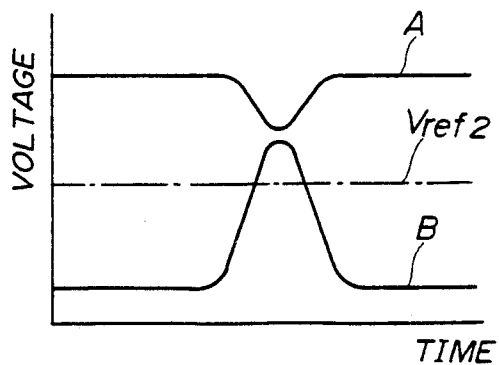
FIG. 4 is a waveform diagram showing the operation of the circuit shown in FIG. 3.

A description will now be given of a case where the memory cell 1 shown in FIG. 1, which is now in the inactive state, is selected and the cell data read out therefrom is the same as that of the currently selected memory cell. It is now assumed that during this time, two or more memory cells are simultaneously selected or no memory cell is selected. In this case, the currents from the read lines RD and $\overline{\text{RD}}$ instantaneously become intermediate levels between the high and low levels. As shown in FIG. 4, the base potential of the transistor Tr13, labeled A, slightly decreases, while the base potential of the transistor Tr15, labeled B, increases a potential higher than the reference voltage Vref2. During the above operation, the base potential A of the transistor Tr13 is maintained at levels higher than the reference voltage Vref2, and the transistor Tr13 is continuously maintained in the ON state. Thus, the transistor Tr18 is continuously maintained in the OFF state, so that the states of the transistors Tr8 and Tr9 do not change. Further, the transistor Tr14 is maintained in the ON state, and the transistor Tr16 is maintained in the OFF state, so that the transistor Tr15 is not turned ON. As a result, the output voltage signal OUT is maintained at the high level, and the output voltage signal $\overline{\text{OUT}}$ is maintained at the low level even when the currents passing from the read lines RD and $\overline{\text{RD}}$ instantaneously become the intermediate levels.

Figure 5:
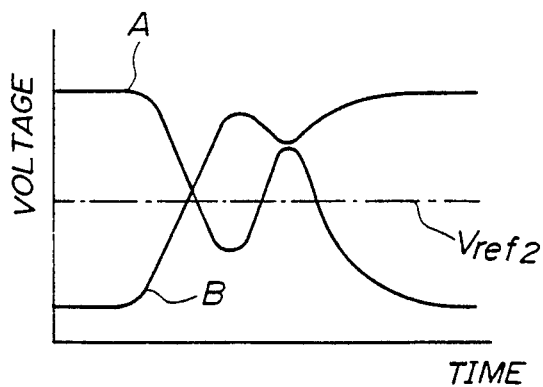
FIG. 5 is a waveform diagram showing the operation of the circuit shown in FIG. 3.

A description will now be given of a case where cell data, which is the inverted version of the cell data read out from the currently selected memory cell, is read out from the memory cell 1 shown in FIG. 1. In this case, the inverted cell data is read out to the read lines RD and $\overline{\text{RD}}$. As shown in FIG. 5, the base potential A of the transistor Tr13 decreases, and the base voltage B of the transistor Tr15 increases. When the base potential A of the transistor becomes lower than the reference voltage Vref2, in the state where the base potential B of the transistor Tr15 is higher than the reference voltage Vref2, the transistor Tr13 is turned OFF and the transistor Tr18 is turned ON as a result, the output transistor Tr9 is turned OFF. Further, the output transistor Tr8 is turned ON in response to the turn-OFF operation of the transistor Tr13, so that the transistors Tr15 and Tr16 are turned ON and maintained in the ON state.

It is now assumed that two or more memory cells are simultaneously selected or no memory cell is selected due to the reading of the inverted data. In this case, the currents from the read lines RD and $\overline{\text{RD}}$ instantaneously become intermediate levels i.e., between the high and low levels. As shown in FIG. 5, the base potential A of the transistor Tr13 decreases to a level lower than the reference voltage Vref2 and then increases to a level higher than the reference voltage Vref2. During this operation, the base potential B of the transistor Tr15 does not decrease to a level lower than the reference voltage Vref2. Thus, the transistor Tr15 is continuously maintained in the ON state, and the transistor Tr17 is continuously maintained in the OFF state. As a result, the states of the output transistors Tr8 and Tr9 do not change, so that the transistor Tr14 is maintained in the OFF state and the transistor Tr16 is maintained in the ON state. Thus, the transistor Tr13 is not turned ON. In the above-mentioned way, the output voltage signal OUT is set to the low level and the output voltage signal $\overline{\text{OUT}}$ is set to the high level without being affected by the occurrence of the intermediate levels which are noise.

Figure 6:
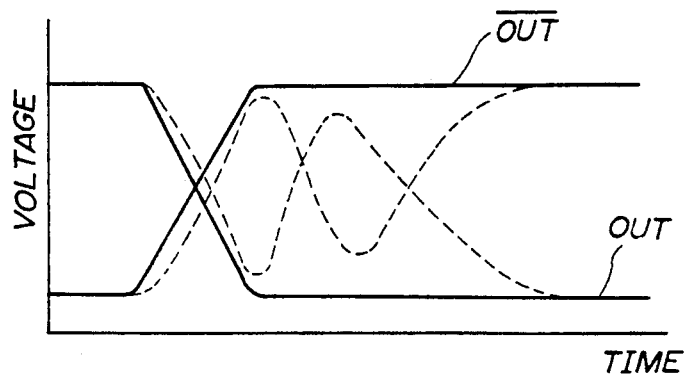
FIG. 6 is a waveform diagram of complementary output voltage signals in connection with the operation shown in FIG. 5.

FIG. 6 is a waveform diagram showing the output voltage signals OUT and $\overline{\text{OUT}}$ in response to the changes in the base potentials A and B. After the base voltage A becomes lower than the reference voltage Vref2, the output voltage signals OUT and $\overline{\text{OUT}}$ are maintained at the low and high levels without being affected in changes in the base potentials A and B. Two curves shown by broken lines are output voltage signals OUT and $\overline{\text{OUT}}$ obtained in the configuration shown in FIG. 1. It can be seen from FIG. 6 that it takes a long time for the output voltages OUT and $\overline{\text{OUT}}$ to be settled or determined in the conventional way. In other words, with the configuration of the embodiment of the present invention, it becomes possible to stably read out the cell data more rapidly than the conventional way.

As has been described above, when the currents passing from the read lines RD and $\overline{\text{RD}}$ become intermediate levels due to the fact that two or more memory cells are simultaneously selected or no memory cell is selected, the base potentials A and B of the transistors Tr13 and Tr15 become higher than the reference voltage Vref2. However, due to the function of the latch circuit 5, including the transistors Tr13 and Tr15, the output voltage signals OUT and $\overline{\text{OUT}}$ are inverted only when one of the base potentials A and B becomes lower than the reference voltage Vref2. With this arrangement, it is possible to prevent the output voltage signals OUT and $\overline{\text{OUT}}$ from becoming intermediate levels and to prevent the output voltages OUT and $\overline{\text{OUT}}$ from en the cell data, which is the same as the previously read cell data, is read out. Further, the output signals OUT and $\overline{\text{OUT}}$ are not affected by a ringing output of the pre-sense amplifier 2. Moreover, the cell data readout operation according to the present invention is faster than that for the conventional way.

The present invention is not limited to the above embodiment. The transistors Tr6 and Tr7 function as capacitance cancellers. It is possible to omit such capacitance cancellers. In this case, the read lines RD and $\overline{\text{RD}}$ are directly coupled to the bases of the transistors Tr11 and Tr12, respectively.

Figure 7:
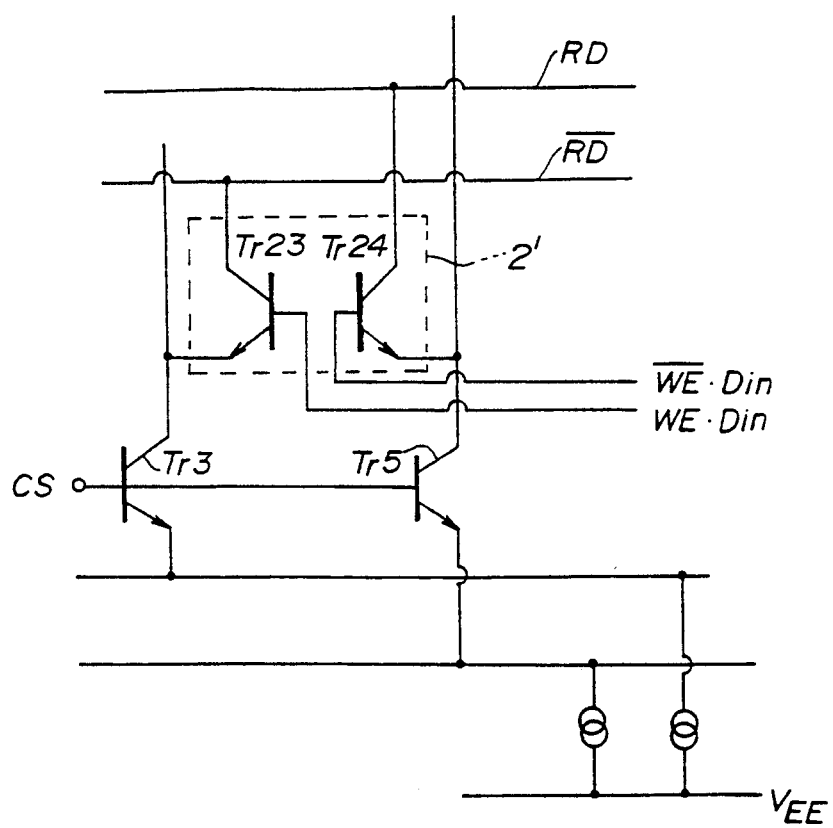
FIG. 7 is a circuit diagram of a pre-sense amplifier different from that shown in FIG. 1.

The pre-sense amplifier is not limited to the configuration shown in FIG. 1. It is possible to employ a current-sense type pre-sense amplifier 2' shown in FIG. 7. The pre-sense amplifier 2' is composed of transistors T23 and T24, the emitters of which are connected to the bit lines BL and $\overline{\text{BL}}$, respectively. The collectors of the transistors Tr23 and Tr24 are connected to the read lines $\overline{\text{RD}}$ and RD, respectively, and the bases of which are applied to the AND logic signals WE.Din and $\overline{\text{WE}}$.-Din, respectively. It is possible to provide a plurality of diodes in place of each of the diodes D1 and D2.

The present invention is not limited to the specifically disclosed embodiments, and variations and modifications may be made without departing from the scope of the present invention.

What is claimed is:

1. A sense amplifier in a semiconductor memory device having plural memory cells arranged in corresponding rows and columns, at least one pair of bit lines coupled to the plurality of memory cells of a column thereof and plural word lines connected to the plurality of memory cells of the respectively corresponding rows, comprising:

detection means for generating complementary state signals exhibiting the respective states of a pair of bit lines coupled to the plurality of memory cells of a corresponding column in the semiconductor memory device and to each of which corresponding word lines are coupled;

an input circuit comprising first and second transistors having corresponding bases thereof connected in common and having the corresponding emitters thereof connected to respective, first and second independent power sources and respectively connected to and receiving the complementary state signals generated by the detection means, the input circuit amplifying the complementary state signals independently of each other and producing as the outputs thereof corresponding, amplified complementary state signals; and latch means, operatively coupled to said input circuit, for receiving said amplified complementary state signals and a reference voltage signal and for inverting the respective states of the received and amplified complementary state signals and outputting the inverted complementary state signals only when the voltage level of one of said received and amplified complementary state signals decreases to a level lower than the voltage level of said reference voltage signal.

2. A sense amplifier as claimed in claim 1, wherein said latch means comprises an asynchronous flip-flop.

3. A sense amplifier as claimed in claim 2, wherein said latch means comprises an RS flip-flop.

4. A sense amplifier as claimed in claim 1, wherein said detection means comprises means for converting the voltage potential levels of said pair of bit lines into said complementary state signals.

5. A sense amplifier as claimed in claim 1, wherein said detection means comprises:
first and second read lines and a constant-current source;
a first transistor having a base coupled to one of said pair of bit lines, an emitter selectively coupled to the constant-current source, and a collector coupled through the first read line to the input circuit;
a second transistor having a base coupled to the other one of said pair of bit lines, an emitter coupled to the emitter of said first transistor, and a collector coupled through the second read line to the input circuit.

6. A sense amplifier as claimed in claim 1, wherein said detection means comprises:
first and second read lines;
a first transistor having a base receiving a first AND logic signal indicating an AND logic combination of a write enable signal and a data signal supplied from an external device, an emitter coupled to one of said pair of bit lines, and a collector coupled through said first read line to the input circuit; and
a second transistor having a base receiving a second AND logic signal indicating an AND logic combination of said data signal and an inverted version of said write enable signal, an emitter coupled to the other one of said pair of bit lines, and a collector coupled through said second read line to the input circuit.

7. A sense amplifier as claimed in claim 1, wherein:
said latch means further comprises first and second input terminals respectively receiving said amplified complementary state signals; and
said sense amplifier further comprises:
a first transistor having a base receiving a predetermined fixed voltage, an emitter receiving one of said complementary state signals and being coupled to a first constant-current source, and a collector coupled to a power supply line, and
a second transistor having a base receiving said predetermined fixed voltage, an emitter receiving the other one of said complementary state signals and being coupled to a second constant-current source, and a collector coupled to said power supply line.

8. A sense amplifier as claimed in claim 1, wherein:
said latch means comprises first and second output terminals at which said inverted complementary output signals are output thereby; and
said sense amplifier further comprises:
a first transistor having a base receiving one of said inverted complementary state signals, an emitter coupled to a first constant-current source, and a collector coupled to a power supply line, and
a second transistor having a base receiving the other one of said inverted complementary state signals, an emitter coupled to a second constant-current source, and a collector coupled to said power supply line.

9. A sense amplifier as claimed in claim 8, wherein said sense amplifier further comprises level shift means for decreasing potentials of the emitters of said first and second transistors by a predetermined level.

10. A sense amplifier as claimed in claim 1, wherein said latch means comprises:
a first transistor having a base operatively coupled to said detection means, a collector coupled to a power supply line via a first resistor, and an emitter;
a second transistor having a base operatively coupled to said detection means, a collector coupled to said power supply line via a second resistor, and an emitter;
a third transistor having a base receiving said reference voltage, an emitter coupled to the emitter of said first transistor, and a collector coupled to the collector of said second transistor;
a fourth transistor having a base receiving said reference voltage, an emitter coupled to the emitter of said second transistor, and a collector coupled to the collector of said first transistor; and
feedback means for feeding back said complementary output signals to the emitters of said third and fourth transistors.

11. A sense amplifier as claimed in claim 10, wherein said feedback means comprises:
a fifth transistor having a collector coupled to the emitters of said first and third transistors, a base receiving one of said complementary output signals, and an emitter coupled to a constant-current source; and
a sixth transistor having a collector coupled to the emitters of said second and fourth transistors, a base receiving the other one of said complementary output signals, and an emitter coupled to said constant-current source.

12. A sense amplifier as claimed in claim 10, wherein said latch means comprises level adjustment means for determining potentials of the bases of said first and second transistors in response to said complementary state signals.

13. A sense amplifier as claimed in claim 1, wherein said reference voltage is a voltage between a high level of each of said complementary state signals and a low level of each of said complementary state signals.

14. A sense amplifier as claimed in claim 1, wherein each of said memory cells comprises a bipolar transistor type memory cell.

* * * * *

UNITED STATES PATENT AND TRADEMARK OFFICE
CERTIFICATE OF CORRECTION

PATENT NO. : 5,297,080
DATED : March 22, 1994
INVENTOR(S) : Yasuhiro YAMAMOTO

It is certified that error appears in the above-indentified patent and that said Letters Patent is hereby corrected as shown below:

Column 2, Line 3, delete "TrB" and substitute --Tr8--.
    Line 36, after "exhibiting" insert --a--.
Column 3, Line 4, after "which" insert --is--.
Column 4, Line 35, before "and" insert --Tr11 decreases--.
Column 5, Line 46, after "ON" insert --;--.
Column 6, line 34, delete "en" and substitute --changing when--.
Column 7, Line 46, after "circuit;" insert --and--.

Signed and Sealed this

Sixteenth Day of August, 1994

Attest:

BRUCE LEHMAN

Attesting Officer      Commissioner of Patents and Trademarks